(12) United States Patent
King

(10) Patent No.: US 8,193,849 B2
(45) Date of Patent: Jun. 5, 2012

(54) GENERATING A FULL RAIL SIGNAL

(75) Inventor: Greg King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/180,193

(22) Filed: Jul. 11, 2011

(65) Prior Publication Data

US 2011/0267129 A1  Nov. 3, 2011

Related U.S. Application Data

(62) Division of application No. 12/346,564, filed on Dec. 30, 2008, now Pat. No. 7,977,997.

(51) Int. Cl.
 *H03K 5/00* (2006.01)
(52) U.S. Cl. .............................. 327/333; 326/62; 326/81
(58) Field of Classification Search .............. 326/62–63, 326/80–81; 327/306, 333
See application file for complete search history.

(56) References Cited

U.S. PATENT DOCUMENTS

| | | | |
|---|---|---|---|
| 6,320,422 B1 | 11/2001 | Koh | |
| 6,624,670 B2 * | 9/2003 | Payne et al. | 327/108 |
| 6,819,142 B2 | 11/2004 | Viehmann et al. | |
| 6,977,534 B2 * | 12/2005 | Radelinow | 327/112 |
| 7,394,283 B2 | 7/2008 | Hsu et al. | |
| 7,403,057 B2 | 7/2008 | Cranford, Jr. et al. | |
| 7,619,448 B2 | 11/2009 | Wu et al. | |
| 7,977,997 B2 | 7/2011 | King | |
| 2010/0164588 A1 | 7/2010 | King | |

* cited by examiner

*Primary Examiner* — Dinh T. Le
(74) *Attorney, Agent, or Firm* — Schwegman, Lundberg & Woessner, P.A.

(57) ABSTRACT

Apparatus, systems, and methods are disclosed, such as those that comprise a center-swing signal generator that includes a push-pull center-swing driver coupled to a common-mode pre-emphasis module, the center-swing signal generator to receive a low swing current mode logic (CML) signal and output a center-swing signal, and a full-swing cross-coupled inverter coupled to the center-swing signal generator, the full-swing cross-coupled inverter to receive the center-swing signal and output a full-rail single-ended swing signal. Additional apparatus, systems, and methods are disclosed.

20 Claims, 6 Drawing Sheets

US 8,193,849 B2

GENERATING A FULL RAIL SIGNAL

PRIORITY APPLICATION

This application is a divisional of U.S. application Ser. No. 12/346,564, filed Dec. 30, 2008, now U.S. Pat. No. 7,977,997, which is incorporated herein by reference in its entirety.

BACKGROUND

Differential signaling (also commonly referred to as double-ended signals) is generally utilized while performing high-speed data transfer with low-swing voltage. Current Mode Logic (CML) is a design technique that uses differential signaling. CML is widely used in high-speed applications due to its relatively low power consumption and low supply voltage when compared to other types of logic, such as emitter-coupled logic (ECL). Circuits that use CML differential signalling typically operate with a differential swing of two to three hundred millivolts. In contrast, a typical complementary metal-oxide semiconductor (CMOS) circuit operates over a range of several volts, using a single ended signal. Combining CML and CMOS circuitry in a single integrated circuit often involves the conversion of a differential signal to a full rail single-ended signal.

BRIEF DESCRIPTION OF THE DRAWINGS

Various embodiments are described in detail in the discussion below and with reference to the following drawings.

DETAILED DESCRIPTION

Various embodiments can include processing systems, semiconductor modules, memory systems and methods. Specific details of several embodiments are set forth in the following description and in FIGS. 1 through 5 to provide an understanding of such embodiments. One of ordinary skill in the art, however, will understand that additional embodiments are possible, and that many embodiments can be practiced without several of the details disclosed in the following description. It is also understood that various embodiments can be implemented within a physical circuit that includes physical components (e.g., "hardware"), or they can be implemented using machine-readable instructions (e.g., "software"), or in some combination of physical components and machine-readable instructions (e.g., "firmware").

In various embodiments, integrated circuits distribute high frequency signals utilizing CML signals. This signaling method utilizes reduced voltage swings and provides a substantially constant supply current draw, which reduces noise disturbances on the signals and provides common mode noise rejection for the circuit as the signals propagate across other blocks of an integrated circuit. At the destination point for these signals, it is useful to convert the CML signal pair to a full rail single ended signal that can be utilized by local digital logic, with the idea of reducing power consumption as compared to using all CML signaling levels. Various mechanisms for receiving a pair of differential current mode logic signal and converting them to a full rail complementary single ended signal are described herein.

Figure 1:
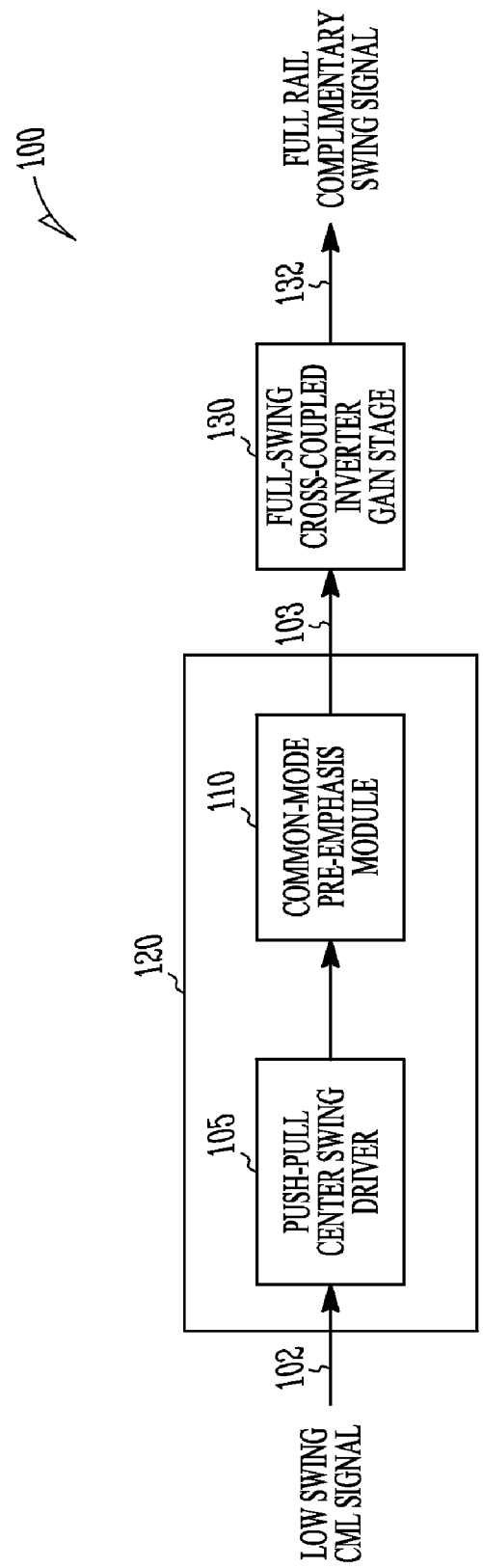
FIG. 1 is a diagrammatic block view of a system to generate a full rail single-ended signal, according to various embodiments.

FIG. 1 is a diagrammatic block view of a system 100 to generate a full rail single-ended signal, according to various embodiments. System 100 includes a center-swing signal generator 120 coupled to a full-swing cross-coupled inverter gain stage 130. The center-swing signal generator 120 is constructed to receive a low swing CML signal at input 102 and provide an output 103 to full-swing cross-coupled inverter gain stage 130. In some embodiments, the center-swing signal generator 120 includes a push-pull center-swing driver 105 coupled to a common-mode pre-emphasis module 110. In this example, the center-swing signal generator 120 receives a low swing CML signal at input 102 and generates a center-swing signal at the output 103. Here, center-swing signal at output 103 is provided to the full-swing cross-coupled inverter gain stage 130, which is configured to generate a full rail single-ended signal at output 132.

Figure 2:
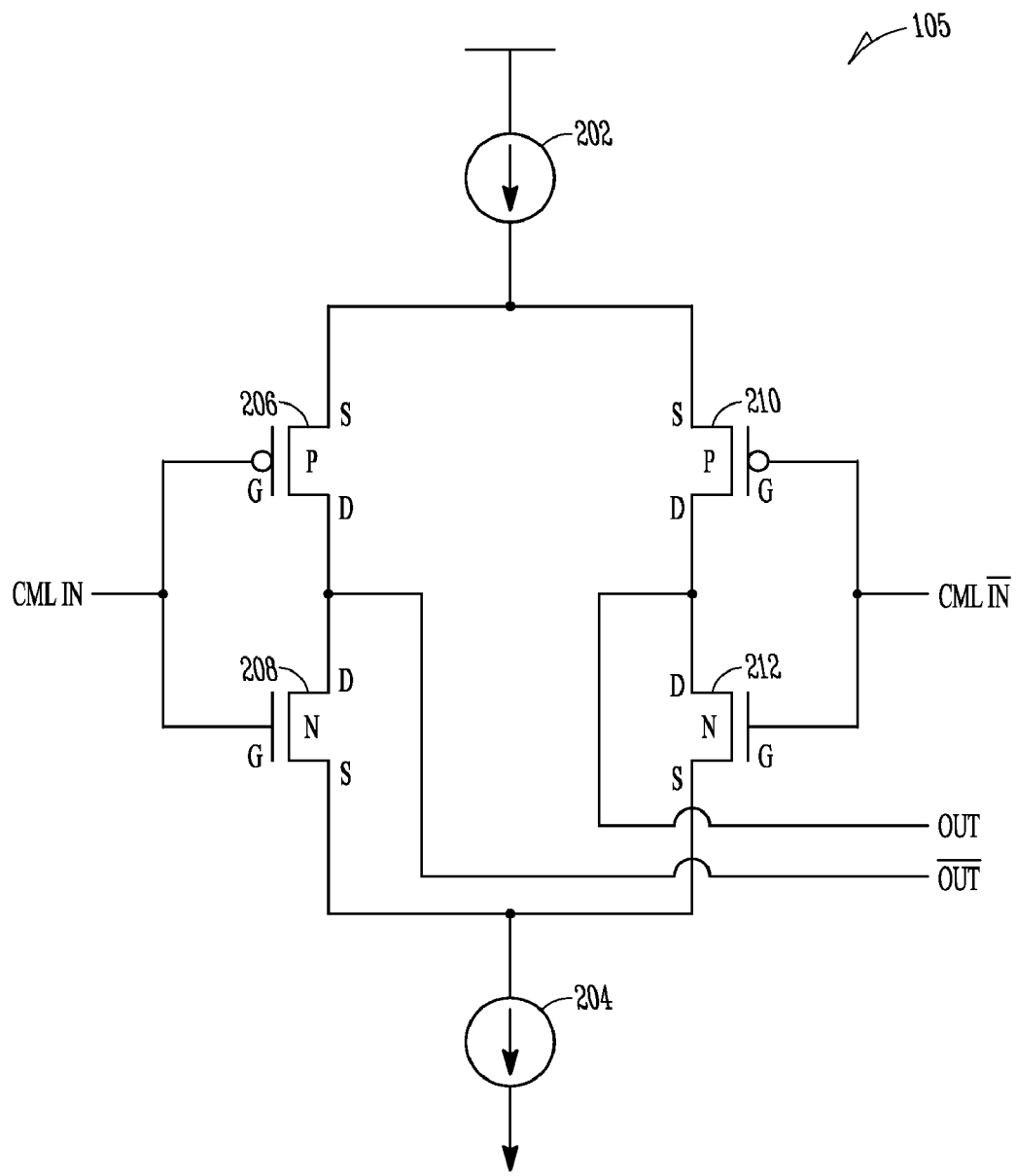
FIG. 2 is a schematic view of a push-pull center-swing driver shown in FIG. 1, according to various embodiments.

FIG. 2 is a schematic view of a push-pull center-swing driver 105 shown in FIG. 1, according to various embodiments. In one example, the push-pull center-swing driver 105 shown in FIG. 2 may comprise a CML buffer that operates with an approximate $V_{DD}/2$ common mode voltage. Push-pull swing driver 105 includes four switch transistors (206, 208, 210, and 212) and current mirrors 202, and 204. In one example, transistors (206, 208, 210, and 212) steer the swing current to generate the high and low voltage transitions. In some embodiments, transistors 206 and 210 are p-type metal oxide semiconductor (PMOS) devices and transistors 208 and 212 are n-type metal oxide semiconductor (NMOS) devices. Here, current source 202 is coupled to the source of transistors 206 and 210 and current source 204 is coupled to the source of transistors 208 and 212. The gates of transistors 206 and 208 are coupled to receive input $CML_{IN}$, and the gates of transistors 210 and 212 are coupled to receive input $\overline{CML_{IN}}$, a signal that is the complement to CML IN. In an example, the drains of transistors 210 and 212 are coupled to provide output signal OUT. In an example, the drains of transistors 206 and 208 are coupled to provide signal $\overline{OUT}$ that is the complement to OUT.

Figure 3A:
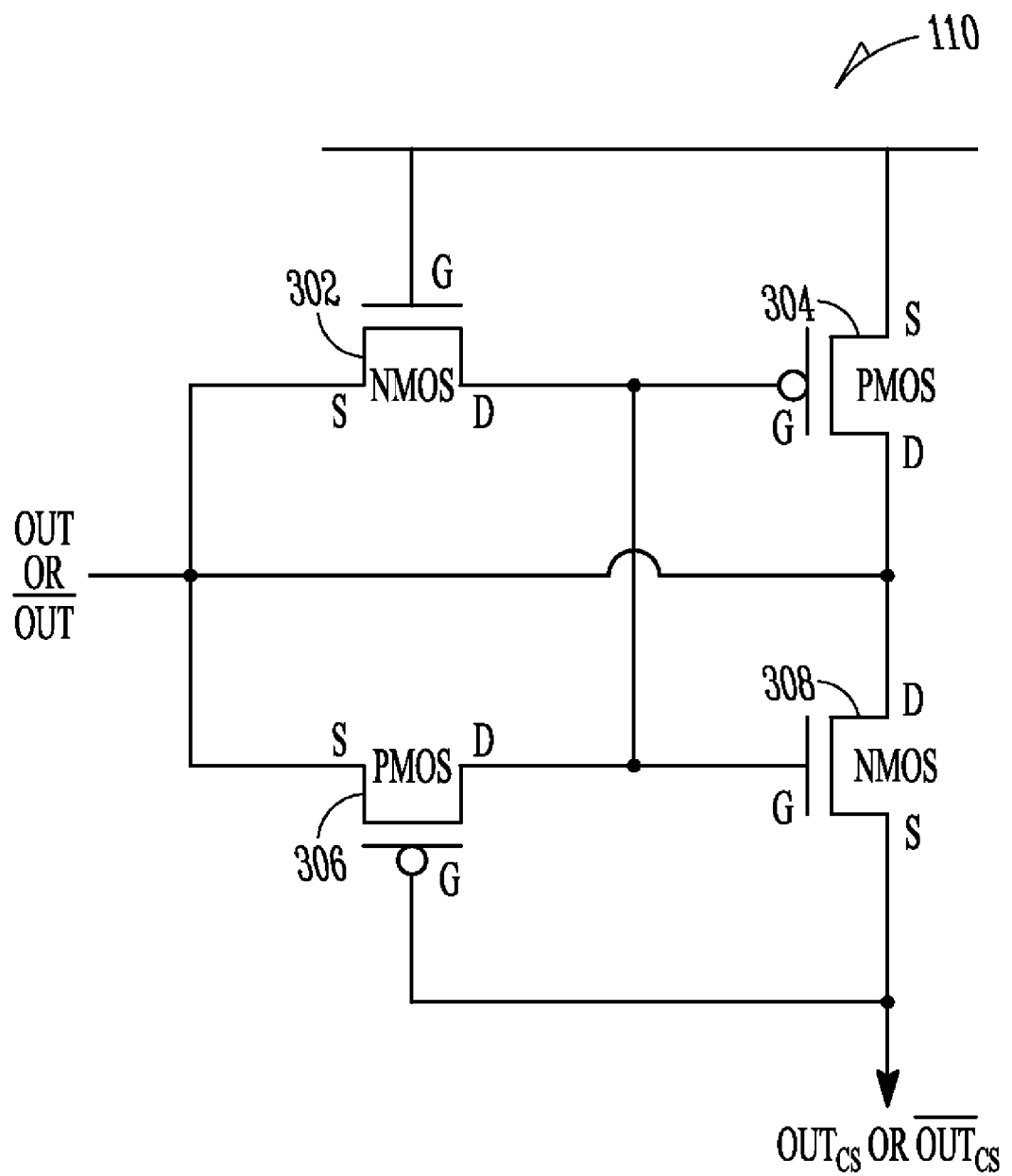
FIG. 3A is schematic view of a common-mode pre-emphasis module shown in FIG. 1, according to various embodiments.

FIG. 3A is schematic view of a common-mode pre-emphasis module 110 shown in FIG. 1, according to various embodiments. In some embodiments, the common-mode pre-emphasis module 110 amplifies the signal received from push-pull center swing driver 105 and centers the signal to a central amplitude (e.g., 0.5V) as shown in FIG. 5B. In some embodiments, common-mode pre-emphasis module 110 includes NMOS transistors 302 and 308 and PMOS transistors 304 and 306. In some embodiments, as shown in FIG. 3, the drain of transistor 302 is coupled to the gate of transistor 304. The gate of transistor 302 and the source of transistor 304 are coupled to a reference voltage. The source of transistor 302 is coupled to the source of transistor 306, and the drain of transistor 306 is coupled to the gate of transistor 308. The drain of transistor 304 is coupled to the drain of transistor 308 and configured to receive the output signal (OUT or $\overline{OUT}$) from push-pull swing driver 105. In addition, the gate of transistor 306 is coupled to the source of transistor 308 to provide a center-swing signal $OUT_{CS}$ or $\overline{OUT_{CS}}$.

Figure 3B:
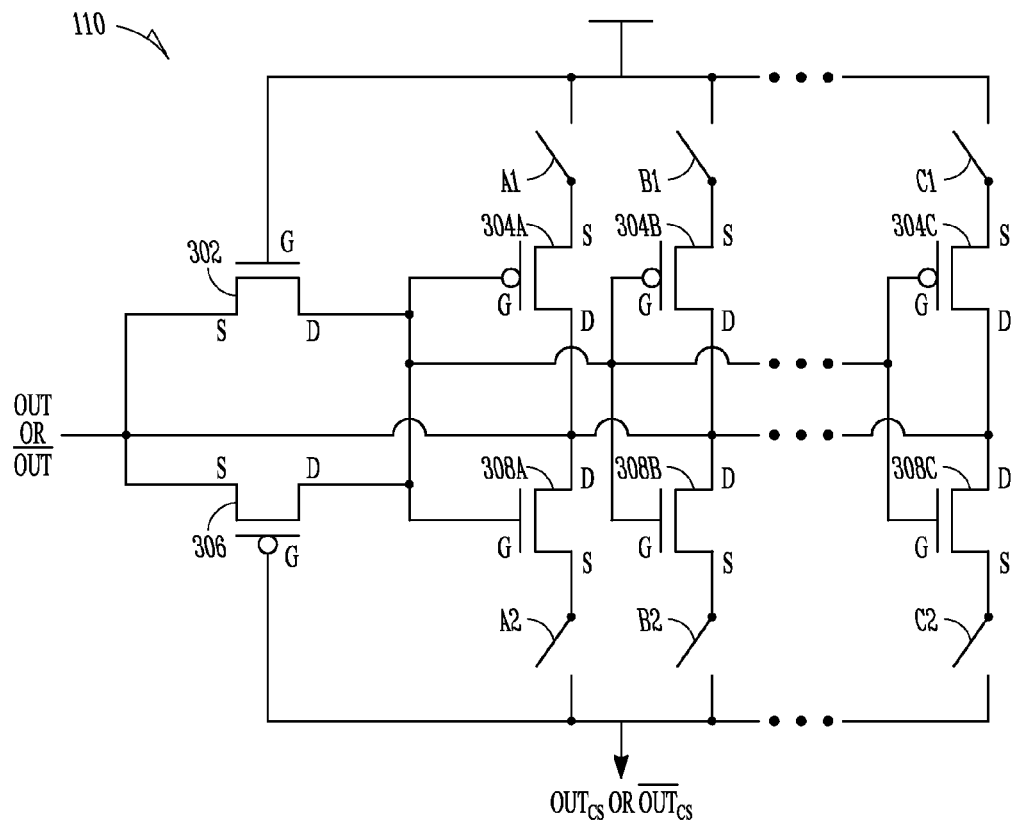
FIG. 3B is a schematic view of a common-mode pre-emphasis module shown in FIG. 1 for selecting different common-mode points, according to various embodiments.

FIG. 3B is a schematic view of a common-mode pre-emphasis module 110 shown in FIG. 1 for selecting different common-mode points, according to various embodiments. In some embodiments, the common-mode pre-emphasis module 110 includes transistors (302, 306, 304A, 304B, 304C, 308A, 308B, and 308C) and switches (A1, A2, B1, B2, C1, and C2). As shown in FIG. 3B, the source of transistor 302 is coupled to the source of transistor 306; the gate of transistor 302 and one end of switches A1, B1, and C1 are coupled to a reference voltage. The remaining ends of switches A1, B1, and C1 are coupled to transistors 304A, 304B, and 304C. The drains of transistors 302 and 306 are coupled to the gates of 304A, 304B, 304C, 308A, 308B, and 308C; the sources of transistors 308A, 308B, and 308C are coupled to one end of switches A2, B2 and C2; and the gate of transistor 306 and remaining end of switches A2, B2, and C2 are coupled to provide output center-swing signals $OUT_{CS}$ or $\overline{OUT_{CS}}$.

In some embodiments, switches A1 and A2 are in the closed position while B1, B2, C1, and C2 are in the open position. In some embodiments, switches B1 and B2 are in the closed position while A1, A2, C1, and C2 are in the open position. In some embodiments, switches C1 and C2 are in the closed position while A1, A2, B1, and B2 are in the open position. In various embodiments, the switches A1, A2, B1, B2, C1, and C2 can be selectively opened and closed to adjust and provide different common mode points for output center-swing signals $OUT_{CS}$ or $\overline{OUT_{cs}}$. In some embodiments, switches (A1, A2, B1, B2, C1, and C2) described herein may comprise a PMOS transistor, an NMOS transistor, or both. In various embodiments, the gates of the PMOS and NMOS transistors used as switches (A1, A2, B1, B2, C1, and C2) can be biased to selectively manipulate switching activity to adjust the common mode points for center-swing signals $OUT_{CS}$ or $\overline{OUT_{CS}}$.

Figure 4:
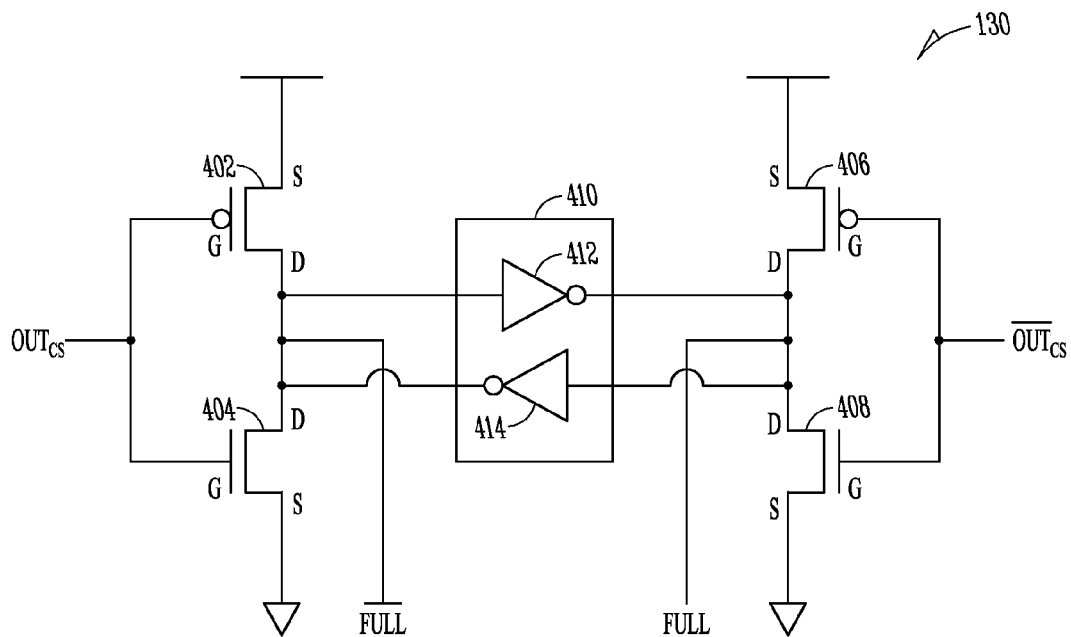
FIG. 4 is a schematic view of a full-swing cross-coupled inverter gain stage shown in FIG. 1, according to various embodiments.

FIG. 4 is a schematic view of a full-swing cross-coupled inverter gain stage 130 shown in FIG. 1, according to various embodiments. In some embodiments, full-swing cross-coupled inverter gain stage 130 includes transistors (402, 404, 406, and 408), and a cross-coupled inverter circuit 410. In some embodiments, cross-coupled inverter circuit 410 includes an inverter 412, and 414. As shown in FIG. 4, the sources of transistors 402 and 406 is coupled to a supply voltage; the gates of transistors 402 and 404 are coupled and configured to receive the $OUT_{CS}$ signal provided by the common-mode pre-emphasis module 110. The drains of transistors 402 and 404 are coupled to each other and coupled to an input end of inverter 412 and an output end of inverter 414 to provide a first portion of the full rail voltage mode signal. The drains of transistors 406 and 408 are coupled to each other and coupled to the output end of inverter 412 and an input end of inverter 414 to provide a second portion of the full rail single-ended signal. The gates of transistors 406 and 408 are coupled to each other and configured to receive the $\overline{OUT_{CS}}$ signal provided by the common-mode pre-emphasis module 110. The remaining ends of the inverters 412 and 414 are coupled to the drains of transistors 406 and 408, and the sources of transistors 404 and 408 are coupled to a reference voltage, such as ground.

Figure 5A:
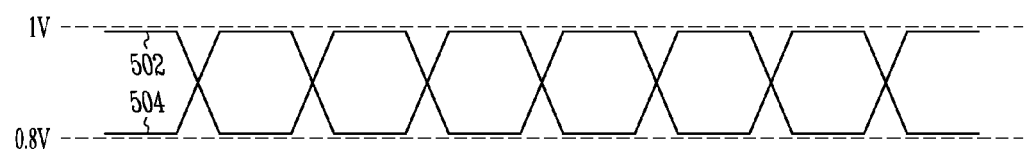
FIG. 5A illustrates a low swing current mode logic (CML) signal received by the center-swing signal generator shown in FIG. 1, according to various embodiments.
Figure 5B:
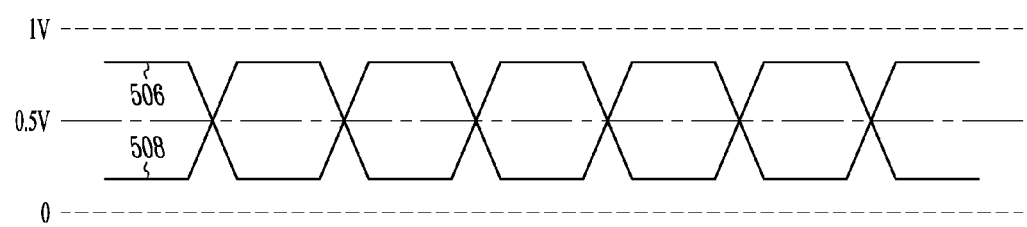
FIG. 5B illustrates a CML differential signal provided at the output of the center-swing signal generator shown in FIG. 1, according to various embodiments.

FIG. 5A illustrates a low swing current mode logic (CML) signal received by the center-swing signal generator shown in FIG. 1, according to various embodiments. As shown in FIG. 5A, the low swing current mode logic signal has two oscillating signals 502 and 504 that are complements of each other. Oscillating signals 502 and 504 are provided as an input to the center-swing signal generator 120. In one example, oscillating signals 502 and 504 oscillate between logic levels that have a logic low level of about 0.8V and logic high level of about 1V, intersecting at a point in between about 0.8V and about 1V. In some embodiments, the logic low and high voltages can take values within the range of about 0.5V to about 3V.

FIG. 5B illustrates a center-swing differential signal provided at the output of the center-swing signal generator shown in FIG. 1, according to various embodiments. As shown in FIG. 5B, the center-swing differential signal includes two oscillating signals 506 and 508 that oscillate around a center voltage of about 0.5V. In some embodiments, the logic low can have a voltage level within the range of about 0V and about 1.5 V. In one example, the logic high can have a voltage level within the range of about 1.5V to about 3V.

Figure 5C:
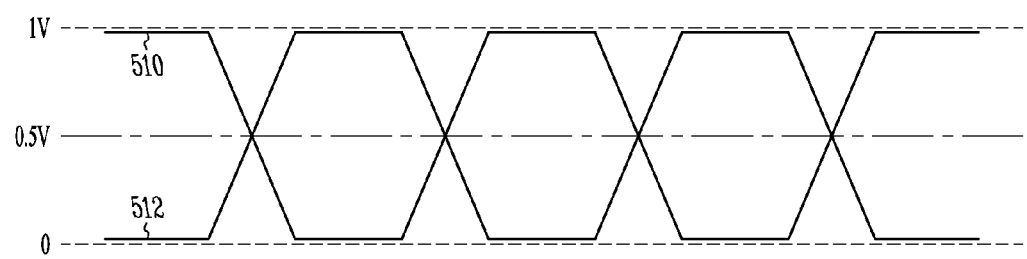
FIG. 5C illustrates a full rail single-ended signal and its complement provided at the output of the full-swing cross coupled inverter gain stage shown in FIG. 1, according to various embodiments.

FIG. 5C illustrates a full rail single-ended (e.g., voltage mode) signal and its complement provided at the output of the full-swing cross coupled inverter gain stage shown in FIG. 1, according to various embodiments. As shown in FIG. 5C, the full rail single-ended signal 510 and its complement 512 that oscillate around a center voltage of about 0.5V. In one example, the logic low can be at a voltage of about 0V and the logic high can be at a voltage of about 1V. In some examples, the center voltage can be about 1.5V, the logic low can be about 0V and the logic high can be about 3V.

Based on simulations, the embodiments provided herein can allow for around 60% reduction in the propagation time as well as a 30-40% reduction in power consumption when compared to conventional designs. In addition, the embodiments provided herein are capable of operating at speeds that can be greater than 5 GHz. The embodiments disclosed herein can be used in any integrated circuit to convert signals from CML to full rail single ended signals. For example, the disclosed embodiments and methods can be used in clock trees and data signal paths.

The push/pull center-swing driver 105, in addition to fast propagation time, will provide rejection of power supply noise using the current mirrors 202 and 204 shown in FIG. 2. The supply current of the push pull driver will be roughly constant which provides for a reduction in the supply current transients (dI/dt) which translates to reduced noise being coupled onto the power or ground supply. The current minor devices 202 and 204 also allow the output signals OUT and $\overline{OUT}$ to be increased or decreased which can be used to optimize output amplitude and power consumption to be optimal for a given application.

The common mode and pre-emphasis circuit has the ability to adjust the desired common mode voltage operating range. This can be used to cancel out transistor offsets in the cross coupled inverter of circuit 130 shown in FIG. 1. In transistor circuits as shown in FIG. 4, device offsets occur in NMOS (404, 408) and PMOS (402, 406) devices which affect the output signals labeled FULL and $\overline{FULL}$. In the ideal case, the FULL/$\overline{FULL}$ signals shown in FIG. 4 will cross at $V_{DD}/2$. However, due to manufacturing variation in the NMOS and PMOS devices, the output signal FULL will not cross exactly at $V_{DD}/2$. The device offsets of the PMOS and NMOS devices can be adjusted by the common mode voltage set by block 110 shown in FIG. 1 to adjust the FULL/$\overline{\text{FULL}}$ signal back to the ideal $V_{DD}/2$ crossing.

Circuit 110 also provides an ability to apply pre-emphasis to the OUT and OUTBAR signals shown in FIG. 3A. Pre-emphasis is an option to drive the output signals to a larger voltage providing an overdrive capability. The ability to apply pre-emphasis to the output signal allows the circuit of 105/110 to drive larger capacitive loads, drive the output signal at higher frequency or to compensate for transistor devices that have lower drive capability due to manufacturing variation.

Circuit 130 has benefits over a standard inverter buffer in that the cross coupled inverter devices shown in FIG. 4 as 410, 412, 414 provide feedback so that the FULL/$\overline{\text{FULL}}$ outputs will be forced to stay close to a $V_{DD}/2$ cross point.

Figure 6:
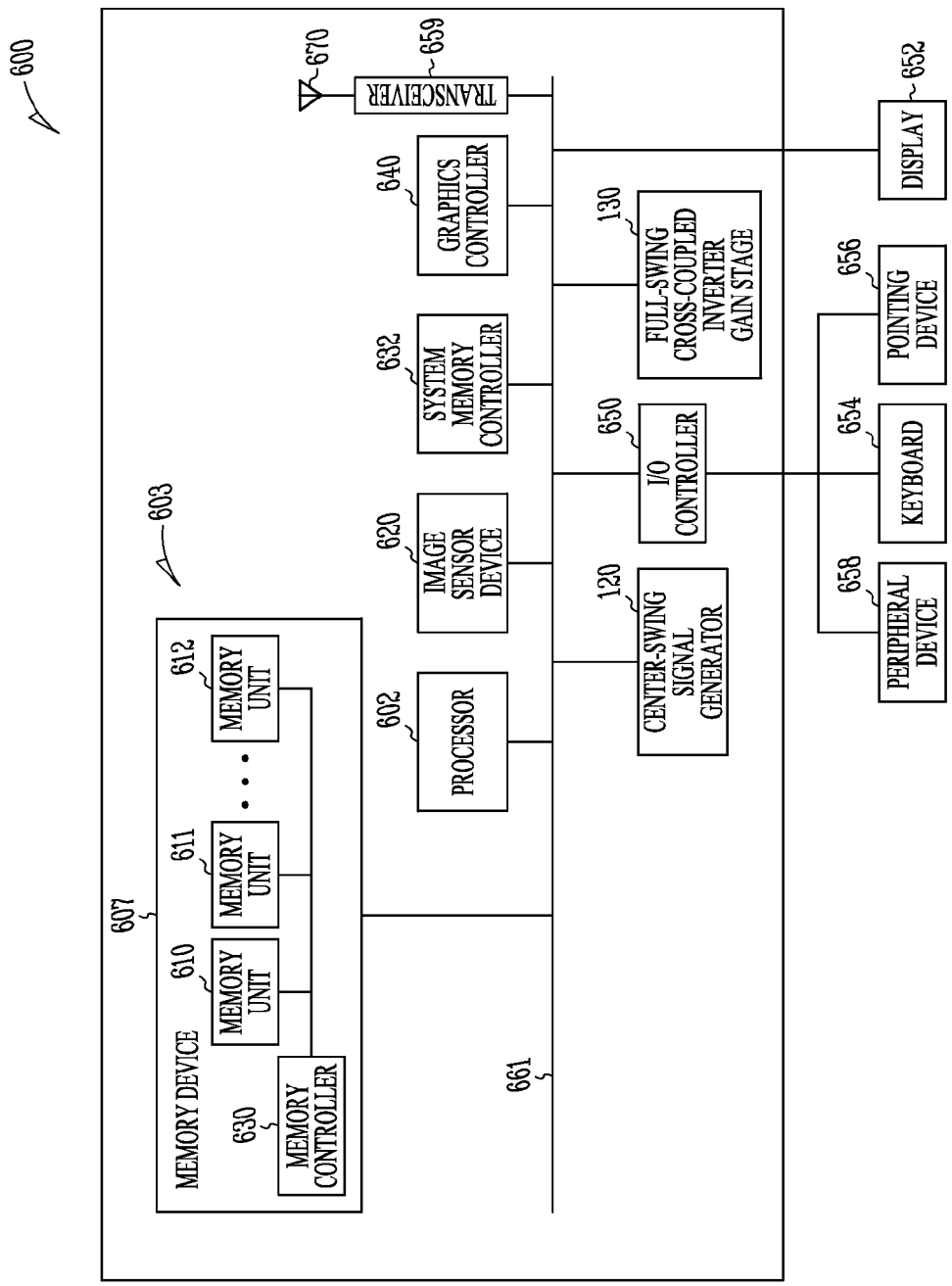
FIG. 6 shows a system, according to various embodiments of the invention.

FIG. 6 shows a system 600, according to various embodiments of the invention. System 600 can include a center-swing signal generator 120, a full-swing cross-coupled inverter 130, a processor 602, a memory device 603, an image sensor device 620, a system memory controller 632, a graphics controller 640, an input and output (I/O) controller 650, a display 652, a keyboard 654, a pointing device 656, a peripheral device 658, a system transceiver 659, and antenna 670 to wirelessly transmit and receive information to and from system 600, a bus 661 to transfer information among the components of system 600, and a circuit board 605 (e.g., motherboard) where some of the components of system 600 can be attached. System 600 can function by omitting the inclusion of some of the components shown in FIG. 6.

Processor 602 can include a general-purpose processor, an application specific integrated circuit (ASIC), or other types of processors. Processor 602 can include a single core processor or a multi-core processor. Processor 602 can execute one or more programming commands to process information. The information can include information provided by other components of system 600 such as memory device 603 or image sensor device 620. Image sensor device 620 can include a complementary metal-oxide-semiconductor (CMOS) image sensor having a CMOS pixel array or charge-coupled device (CCD) image sensor having a CCD pixel array. In an example, processor 602 is coupled to the center-swing generator 120 and the full-swing cross-coupled inverter 130 and can be configured to control at least one of the center-swing signal generator 120 and the full-swing cross-coupled inverter 130.

Memory device 603 can include memory units 610, 611, and 612 and a device memory controller 630. Each of memory units 610, 611, and 612 can be enclosed in a separate IC package. FIG. 6 shows memory device 603 having three memory units 610, 611, and 612 as an example. However, the number of memory units of memory device 603 can vary. FIG. 6 shows an example where memory controller 630 and memory units 610, 611, and 612 are located in the same board 607 (e.g., a board of a dual in-line memory module "DIMM"). However, memory controller 630 and memory units 610, 611, and 612 can be located in different boards, such as in board 607 and in circuit board 605, or can be scattered in different locations in system 600.

Memory device 603 can include a volatile memory device, a non-volatile memory device, or a combination of both. For example, memory device 603 can include a dynamic random access memory (DRAM) device, a static random access memory (SRAM) device, a flash memory device, phase change memory device, or a combination of these memory devices.

The illustrations of circuits (e.g., 200, 300, and 400) and systems (e.g., system 600) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, circuits 200, 300, and 400 and systems (e.g., system 100, 600) described above can all be characterized as "modules" (or "module") herein. Such modules can include hardware circuitry, single and/or multi-processor circuits, memory circuits, software program modules and objects and/or firmware, and combinations thereof, as desired by the architect of the circuits (e.g., circuits 200, 300, and 400) and systems (e.g., system 600), and as appropriate for particular implementations of various embodiments. For example, such modules can be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

While various embodiments have been illustrated and described, as noted above, changes can be made without departing from the disclosure. The accompanying drawings that form a part hereof show by way of illustration, and not of limitation, various embodiments in which the subject matter can be practiced. The embodiments illustrated are described in sufficient detail to enable those skilled in the art to practice the teachings disclosed herein. Other embodiments can be utilized and derived therefrom. This Detailed Description, therefore, is not to be taken in a limiting sense.

Although specific embodiments have been illustrated and described herein, it should be appreciated that any arrangement calculated to achieve the same purpose can be substituted for the various embodiments shown. Furthermore, although the various embodiments have described redundant signal transmission systems, it is understood that the various embodiments can be employed in a variety of known electronic systems and devices without modification. This disclosure is intended to cover any and all adaptations or variations of various embodiments. Combinations of the above embodiments, and other embodiments not specifically described herein, will be apparent to those skilled in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the meaning of the claims. In addition, in the foregoing Detailed Description, it can be seen that various features can be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:
1. An apparatus comprising:
 a center-swing signal generator circuit including a first n-type metal oxide semiconductor (NMOS) transistor and a first p-type metal oxide semiconductor (PMOS) transistor coupled in parallel to each other, the first NMOS transistor and the first PMOS transistor disposed between a reference voltage location and an output, a gate of the first NMOS transistor coupled to the reference voltage location and a gate of the PMOS transistor coupled to the output; and a second NMOS transistor and a second PMOS transistors coupled in series to each other, the second NMOS transistor and the second PMOS transistor disposed between a first switch and a second switch, the first switch coupled to the reference voltage location and the second switch coupled to the output, gates of the second NMOS transistor and the second PMOS transistors coupled to drains of the first NMOS transistor and the first PMOS transistor.

2. The apparatus of claim 1, wherein the apparatus comprises:

a third NMOS transistor and a third PMOS transistor coupled in series to each other and between a third switch and a fourth switch, the third switch coupled to the reference voltage location and the fourth switch coupled to the output, gates of the third NMOS transistor and the third PMOS transistor coupled to the drains of the first NMOS transistor and the first PMOS transistor.

3. The apparatus of claim 1, wherein a source of the first NMOS transistor is coupled to a source of the first PMOS transistor and configured to receive an input signal.

4. The apparatus of claim 2, wherein at least one of the first switch, the second switch, the third switch, or the fourth switch includes a PMOS transistor.

5. The apparatus of claim 2, wherein at least one of the first switch, the second switch, the third switch, or the fourth switch includes an NMOS transistor.

6. The apparatus of claim 2, wherein at least one of the first switch, the second switch, the third switch, or the fourth switch, when activated, operates to adjust the center voltage level of the center-swing signal.

7. The apparatus of claim 6, wherein the center voltage level of center-swing signal can be adjusted to a voltage selected from the range of about 0V to about 3V.

8. An apparatus comprising:

a center-swing signal generator circuit having a push-pull center-swing driver coupled to a common-mode pre-emphasis module, the common-mode pre-emphasis module including a first n-type metal oxide semiconductor (NMOS) transistor and a first p-type metal oxide semiconductor (PMOS) transistor coupled in parallel to each other, the first NMOS transistor and the first PMOS transistor disposed between a reference voltage location and an output, a gate of the first NMOS transistor coupled to the reference voltage location and a gate of the PMOS transistor coupled to the output; and a second NMOS transistor and a second PMOS transistors coupled in series to each other, the second NMOS transistor and the second PMOS transistor disposed between a first switch and a second switch, the first switch coupled to the reference voltage location and the second switch coupled to the output, gates of the second NMOS transistor and the second PMOS transistors coupled to drains of the first NMOS transistor and the first PMOS transistor.

9. The apparatus of claim 8, wherein the push-pull center-swing driver includes:

a first input arranged to receive a first signal;

a second input arranged to receive a complement to the first signal; and a plurality of transistors to generate an output signal from the push-pull center-swing driver to the common-mode pre-emphasis module or a complement of the output signal from the push-pull center-swing driver to the common-mode pre-emphasis module.

10. The apparatus of claim 8, wherein the push-pull center-swing driver includes:

two current minors; and four switch transistors arranged such that the four switch transistors steer swing current to generate high and low voltage transitions.

11. The apparatus of claim 8, wherein the push-pull center-swing driver includes a third PMOS transistor coupled to a fourth PMOS transistor;

a first current mirror coupled to a source of the third PMOS transistor and coupled to a source of the fourth PMOS transistor;

a third NMOS transistor coupled to a fourth NMOS transistor;

a second current mirror coupled to a source of the third NMOS transistor and coupled to a source of the fourth NMOS transistor;

gates of the third NMOS transistor and the third PMOS transistor arranged to receive a first signal;

gates of the fourth NMOS transistor and the fourth PMOS transistor arranged to receive a complement to the first signal; and drains of the fourth NMOS transistor and the fourth PMOS transistor coupled to provide an output signal; and drains of the third NMOS transistor and the third PMOS transistor coupled to provide a complement of the output signal, wherein the push-pull center-swing driver and the common-mode pre-emphasis module are arranged such that the output signal or the complement of the output signal is operatively provided to the common-mode pre-emphasis module.

12. The apparatus of claim 8, wherein the push-pull center-swing driver is configured to provide rejection of power supply noise using current minors.

13. The apparatus of claim 8, wherein the first and second switches are operable to be biased to selectively manipulate switching activity to adjust common mode points for a center-swing signal and a complement of the center-swing signal from the common-mode pre-emphasis module.

14. The apparatus of claim 13, wherein the first and second switches are transistors.

15. An apparatus comprising:

a center-swing signal generator circuit including a first n-type metal oxide semiconductor (NMOS) transistor and a first p-type metal oxide semiconductor (PMOS) transistor coupled in parallel to each other, the first NMOS transistor and the first PMOS transistor disposed between a reference voltage location and an output, a gate of the first NMOS transistor coupled to the reference voltage location and a gate of the PMOS transistor coupled to the output; and a second NMOS transistor and a second PMOS transistors coupled in series to each other, the second NMOS transistor and the second PMOS transistor disposed between a first switch and a second switch, the first switch coupled to the reference voltage location and the second switch coupled to the output, gates of the second NMOS transistor and the second PMOS transistors coupled to drains of the first NMOS transistor and the first PMOS transistor; and a full-swing inverter gain stage coupled to the center-swing signal generator circuit, the full-swing inverter gain stage arranged to provide a full rail signal based on a signal input from the center-swing signal generator circuit.

16. The apparatus of claim 15, wherein the full-swing inverter gain stage a third PMOS transistor coupled to a third NMOS transistor, the third PMOS transistor and the third NMOS transistor arranged to receive an output from the center-swing signal generator circuit and arranged to provide a complement of the full rail signal from a coupling of the third PMOS transistor to the third NMOS transistor;

an inverter circuit coupled to the third PMOS transistor and to the third NMOS transistor; and a fourth PMOS transistor coupled to a fourth NMOS transistor, both the fourth PMOS transistor and the fourth NMOS transistor coupled to the inverter circuit, the fourth PMOS transistor and the fourth NMOS transistor arranged to receive a complement of the output from the center-swing signal generator circuit and arranged to provide the full rail signal from a coupling of the fourth PMOS transistor to the fourth NMOS transistor.

17. The apparatus of claim 16, wherein both a source of the third PMOS transistor and a source of the fourth PMOS transistor are coupled to a supply voltage location, both a gate of the third PMOS transistor and a gate of the third NMOS transistor are coupled to receive the output from the center-swing signal generator circuit; both a gate of the fourth PMOS transistor and a gate of the fourth NMOS transistor are coupled to receive the complement of the output from the center-swing signal generator circuit; and both a source of the third NMOS transistor and a source of the fourth NMOS transistor are coupled to a second reference voltage location.

18. The apparatus of claim 17, wherein the inverter circuit includes a first inverter and a second inverter, the first inverter having an input coupled to a drain of the third PMOS transistor and an output coupled to a drain of the fourth PMOS transistor, the second inverter having an input coupled to a drain of the fourth NMOS transistor and an output coupled to a drain of the third NMOS transistor.

19. The apparatus of claim 15, wherein device offsets of the first NMOS transistor, the first PMOS transistor, the second NMOS transistor, and the second PMOS transistor can be adjusted to adjust crossing of the full rail signal and the complement of the full rail signal to one-half of a supply voltage.

20. The apparatus of claim 15, wherein the center-swing signal generator circuit includes a push-pull center-swing driver coupled to the first NMOS transistor and the first PMOS transistor.

* * * * *